US009660158B2

(12) United States Patent
Stanley et al.

(10) Patent No.: US 9,660,158 B2
(45) Date of Patent: May 23, 2017

(54) INFRARED EMITTER

(71) Applicant: CSEM Centre Suisse d'Electronique et de Microtechnique SA—Recherche et Développement, Neuchâtel (CH)

(72) Inventors: Ross Stanley, Epalinges (CH); Branislav Timotijevic, Lausanne (CH)

(73) Assignee: CSEM Centre Suisse d'Electronique et de Microtechnique SA—Recherche et Développement, Neuchâtel (CH)

( * ) Notice: Subject to any disclaimer, the term of this patent is extended or adjusted under 35 U.S.C. 154(b) by 0 days.

(21) Appl. No.: 15/159,397

(22) Filed: May 19, 2016

(65) Prior Publication Data

US 2016/0343921 A1   Nov. 24, 2016

(30) Foreign Application Priority Data

May 22, 2015   (EP) .................................... 15169038

(51) Int. Cl.
*H01L 29/227* (2006.01)
*H01L 33/60* (2010.01)
(Continued)

(52) U.S. Cl.
CPC .............. *H01L 33/60* (2013.01); *H01K 1/04* (2013.01); *H01K 1/14* (2013.01); *H01L 27/153* (2013.01);
(Continued)

(58) Field of Classification Search
CPC ..... H01L 27/153; H01L 33/20; H01L 33/505; H01L 33/58; H01L 33/60; H01L 2933/0083; H01L 2933/0091
(Continued)

(56) References Cited

U.S. PATENT DOCUMENTS 6,297,511 B1* 10/2001 Syllaios ..................... F41J 2/02
250/493.1

2006/0154401 A1* 7/2006 Gardner ............... G01N 27/128
438/53
(Continued)

FOREIGN PATENT DOCUMENTS

EP          1 779 418 B1    9/2014

OTHER PUBLICATIONS

Baltes, H.P., "Planck's Radiation Law for Finite Cavities and Related Problems," Infrared Physics, vol. 16, Issues 1-2, Jan.-Mar. 1976, p. 1-8.
Liu, X., et al., "Taming the Blackbody with Metamaterials," May 2011 <http://scholar.google.com/scholar_url?url=http://arxiv.org/pdf/1105.2708&hl=en&sa=X&scisig=AAGBfm3U4aarhhdTRxYIGFCzjWCzSbM3_A&nossl=1&oi=scholarr> [retrieved May 18, 2016], 5 pages.
(Continued)

*Primary Examiner* — Matthew E Warren
(74) *Attorney, Agent, or Firm* — Christensen O'Connor Johnson Kindness PLLC

(57) ABSTRACT

The disclosure concerns an infrared emitter is provided comprising a metalized membrane emitting infrared light in operation. The membrane comprises a two dimensional array of infrared wavelength sized through-holes and to each side a thin metal layer comprising also an array of through-holes. The through-holes are arranged as a two-dimensional periodic array and each of said through-holes have a cross section having a maximum and a minimum dimension of less than any wavelength of the emitted infrared light. The peak wavelength of the emitted infrared light is proportional to the periodicity of the through-holes. At least one of the metal layers is connected to an electrical current source that provides an electrical current that heats at least one of the metal layers so that a narrow bandwidth and highly directive light beam of infrared light is emitted. The membrane is arranged on a membrane support and both are made of a material that resists to temperatures higher than 400°.

17 Claims, 11 Drawing Sheets

(51) Int. Cl.
*H01L 27/15* (2006.01)
*H01K 1/04* (2006.01)
*H01K 1/14* (2006.01)
*H01L 33/26* (2010.01)
*H01L 33/48* (2010.01)
*H01L 33/58* (2010.01)
*H01L 33/62* (2010.01)

(52) U.S. Cl.
CPC ............ *H01L 33/26* (2013.01); *H01L 33/483* (2013.01); *H01L 33/58* (2013.01); *H01L 33/62* (2013.01); *H01L 2933/0091* (2013.01)

(58) Field of Classification Search
USPC .............................................. 257/79, 98, 99
See application file for complete search history.

(56) References Cited

U.S. PATENT DOCUMENTS

2008/0272389 A1* 11/2008 Rogne ................... G01J 3/108
257/99
2014/0291704 A1* 10/2014 Ali ........................ H01L 33/34
257/88

OTHER PUBLICATIONS

Reiser, A. and Schächter, L., "Geometric Effects on Blackbody Radiation," Physical Review A 87, 033801, Mar. 2013, 13 pages.

* cited by examiner

INFRARED EMITTER

FIELD OF THE DISCLOSURE

The present disclosure relates to the field of infrared light emitting devices. More particularly, the present disclosure relates to a micro-machined narrow-band infrared light emitter having a directional light emission and which is based on a membrane comprising an array of holes.

BACKGROUND

Despite the wide diversity of available infrared light sources, there is no equivalent in the infrared of a light emitting device (LED), i.e. an intense light source having a limited infrared spectral linewidth, a good directivity of its emitted infrared light beam and which is easy to manufacture, so relatively cheap.

Instead, there are a great variety of thermal light sources which are used for low end applications. The limiting issues with these infrared light sources are mainly:
- their infrared emission spectrum follows closely the one of a blackbody;
- the emitted radiation is omnidirectional, such as a Lambertian angular distribution;
- the light modulation is very limited and intensity modulation frequencies are typically smaller than some Hertz;
- the conversion of the electrical energy in useful infrared radiation is poor;
- the packaging of these light source requires often a vacuum or inert gas environment.

The most common thermal source is a heated tungsten filament as the one found in light bulbs. These thermal sources are well known to have broadband emission in the visible and the infrared, which roughly follows the spectral dependence of a blackbody (FIG. 1). This can be generalized to all thermal sources wherein the optical energy is radiated thermal energy. The emission intensity at a given temperature and wavelength per unit wavelength and per unit angle in this case will be:

$$I(T,\lambda) = \in(T,\lambda,\theta) B(T,\lambda)$$

Where $\in(T,\lambda,\theta)$ is the material emissivity and $B(T,\lambda)$ is the blackbody radiation at the given temperature (T) and wavelength ($\lambda$), and $\theta$ is the emission angle. The blackbody radiation spectrum is a fundamental physical property that applies to all macroscopic systems and can show some variations in microscopic systems as explained in: H. P. Baltes, Infrared Physics 1976, vol. 16, pp. 1-8.

While the blackbody spectrum is difficult to change, for light source purposes for example, some attempts have been made to achieve this as explained in: A. Reiser and L. Schächter, Physical Review A 87, 033801 (2013). On the other hand, the emissivity can be changed in many ways. Through Kirchoff's law the emissivity and the absorptivity of a heated body are the same. Therefore the goal of engineering a thermal source emission can be solved by engineering the absorption of the thermal sources so that it achieves the required emissive needs.

There have been many attempts to overcome the issues of the infrared emission spectral width, its directionality and its modulation speed by using periodic structures to control the infrared light emission. These concepts can be divided into two groups, i.e. photonic crystals and sandwich structures such as metal-insulator stacks.

Photonic structures are used to inhibit the emission of certain wavelengths and the emission in certain directions. Variants based on both dielectric materials and metals have been demonstrated. The implementations using metals (woodpiles) are extremely difficult and costly to fabricate. Variants based on dielectrics, while showing a non-blackbody spectrum have strong off-band emission properties and it is difficult to obtain a well-defined emission spectrum centered on a chosen central infrared wavelength.

EP 1779418B1 describes a photonic crystal emitter in which infrared light is provided by the heating of a semiconductor material. The infrared light is transmitted by a metal layer. The limitation of the device of EP 1779418B1 is the limited modulation frequency that may be achieved and which is limited by the mass of the semiconductor material layer. Another limitation of the device is the limitation in the reduction of the spectral width that may be achieved with the device.

In the case of metal-Insulator sandwich structures, the most successful attempts to control the emission have been with absorbing dielectric layers that are sandwiched between two metal layers. Metal-Insulator sandwich structures have in general one continuous metal layer, acting as optical ground plate and heater, and one structured layer so as to provide path antennas, as described in: Xianliang Liu et al. "Taming the Blackbody with Infrared Metamaterials as Selective Emitted", Phys Rev let. 107, 045901 (2011). Xianliung et al. describe in their paper a narrow band thermal emitter by using metallic crosses on top of an absorber on top of a continuous metal film. The absorption of the thin layer is enhanced significantly at certain resonant wavelengths leading to narrow band emission when the device is heated. The drawback of such a structure is again off-band emission. Also, the layered nature of the device is very sensitive to delamination under repeated temperature cycling of the device.

SUMMARY OF THE DISCLOSURE

The disclosure relates to an infrared emitter comprising a membrane comprising at least one metal layer which is heated and which, in operation, emits at least one infrared light beam. The emitted infrared light beam is a narrow band infrared light beam which has also a better directivity, compared to a Lambertian emitter, and which may be modulated at high frequencies. Said membrane comprises a first surface and a second surface, parallel to said first surface. The membrane comprises a two-dimensional periodic array of through-holes. The through-holes in the membrane extend from said first surface to said second surface.

The membrane is arranged on a membrane support and is made of a dielectric material. The membrane and the membrane support are made of a material in some embodiments that resists to temperatures higher than 400° C., and in some embodiments higher than 600° C. The membrane may have a dimension, in the plane of the membrane, of some millimeters. The thickness of the membrane is typically some hundreds of μm.

The advantage of the presented disclosed thermal emitter compared to prior art devices is that it allows to achieve a cheap device that has a better suppression of off-band frequencies, a better directionality and a relatively high modulation frequency (e.g., >10 Hz). The device also brings in the novelty that the metal layer is used as both the heating layer and to filter the emitted radiation, while in prior art devices, for example in the case of sandwich structures, the whole sandwich stack is heated and only the metal layer is used to filter the infrared radiation.

The through-holes of the metalized membrane are arranged in a two-dimensional periodic array. The array may be any type of periodic two-dimensional arrangement, such as a hexagonal or a square arrangement of the through-hole. The through-holes have each a cross section that has a maximum and a minimum dimension of than the wavelengths in the narrow wavelength band of the emitted infrared light, the cross section being defined for any position in the length of the through-holes.

A first metal layer is arranged on at least a portion of the first surface and a second metal layer is arranged on at least a portion of the second surface. A portion of the first metal layer and/or the second metal layer is deposited at least partially on the wall of at least one through-hole of the two-dimensional array so that the first metal layer and the second metal layer are always electrically in contact. The first and second metal layer may overlap, on the walls inside the through holes. The first metal layer and the second metal layer in some embodiments are made of the same metal, including but not limited to platinum or any other metal resistive to high temperatures. In other embodiments, the first and second metal layers are made from different metals. The wording "resistive" is defined in the sense that the metal layers do not deform, keep their homogeneity and their adherence to the membrane and does not alter its infrared emitting characteristics.

Each of the through-holes in the membrane faces a through-hole in the first metal layer and a through-hole in the second metal layer. At least one of the first metal layer or the second metal layer is electrically connected in series to an electrical current source. The first metal layer and/or the second metal layer is adapted to emit infrared light in response to heating caused by the introduction of electrical current in the respective metal layers, the infrared light having an infrared spectrum which is determined in response to the decay of surface waves, also referred to as surface plasmons and/or spoof surface plasmons in the first metal layer and/or the second metal layer. The advantage of heating a very thin metal layer comprising periodically arranged through-holes is that a highly directive and narrow band infrared light beam may be provided which may be modulated at a high frequency, typically higher than 20 Hz.

The infrared emitter is arranged to provide at least one emitted infrared light beam, emitted to the side of the first surface and in a direction opposite to the second surface.

The infrared light beam has wavelengths higher than 700 nm in some embodiments and has a spectral width of less than 3000 nm in some embodiments, less than 1500 nm in other embodiments, less than 1000 nm in still other embodiments, and less than 500 nm in yet other embodiments.

The infrared emitter is arranged so that the emitted infrared light beam may be modulated in intensity with a frequency higher than 10 Hz in some embodiments, higher than 20 Hz in other embodiment, and higher than 50 Hz in yet other embodiments. Directionality of the infrared source described here is directly linked to the angular dependence of the coupling to the metal. Considering that the absorption is the angle (direction) dependent (as well as wavelength dependent), the emission will be the same (Kirchhoff's law). The emitted infrared light beam has a low divergence. In embodiments the divergence of the emitted infrared light beam divergence, defined as the total angle at half intensity, is less than 90°, is less than 75°, or is less than 45°.

In an embodiment the membrane is a SiN membrane. In an embodiment the membrane support is made in silicon.

In an embodiment a membrane support base is arranged to the membrane support, to the side of the second surface.

In an embodiment the membrane support base comprises a reflecting layer arranged to the side of the second surface. The reflecting layer is arranged to reflect at least a reflected portion of a second infrared light beam emitted by the membrane to the side opposite to the first surface.

In an embodiment the reflecting layer is a structured reflecting layer. The reflecting layer may be a metallic layer.

In an embodiment the reflecting layer is a diffracting layer.

In an embodiment the reflecting layer is arranged to focus at least a portion of the reflected portion into at least one of the through holes. This allows enhancing the emitted infrared light intensity.

The disclosure is further achieved by an infrared emitter array comprising at least two infrared emitters. The infrared emitter array may comprise different types of infrared emitters as described. The advantage of arranging several infrared emitters in an array is to achieve a higher intensity and allows to have a wide design range of the emitted infrared light beam. In addition, an array comprising different infrared emitters according to the disclosure allows for independent emission at different parts of the spectrum from the same device.

The disclosure is further achieved by a method for obtaining an infrared light beam in a narrow band of infrared wavelengths and having a high angular directivity and wherein an infrared emitter as described above emits infrared light by the heating of the first or second metal layer by resistive heating provided by the electrical current of a current source connected to the first or second metal layer.

DESCRIPTION OF THE DRAWINGS

Further details of the disclosure will appear more clearly upon reading the following description in reference to the appended figures, which show.

DETAILED DESCRIPTION

Figure 1:
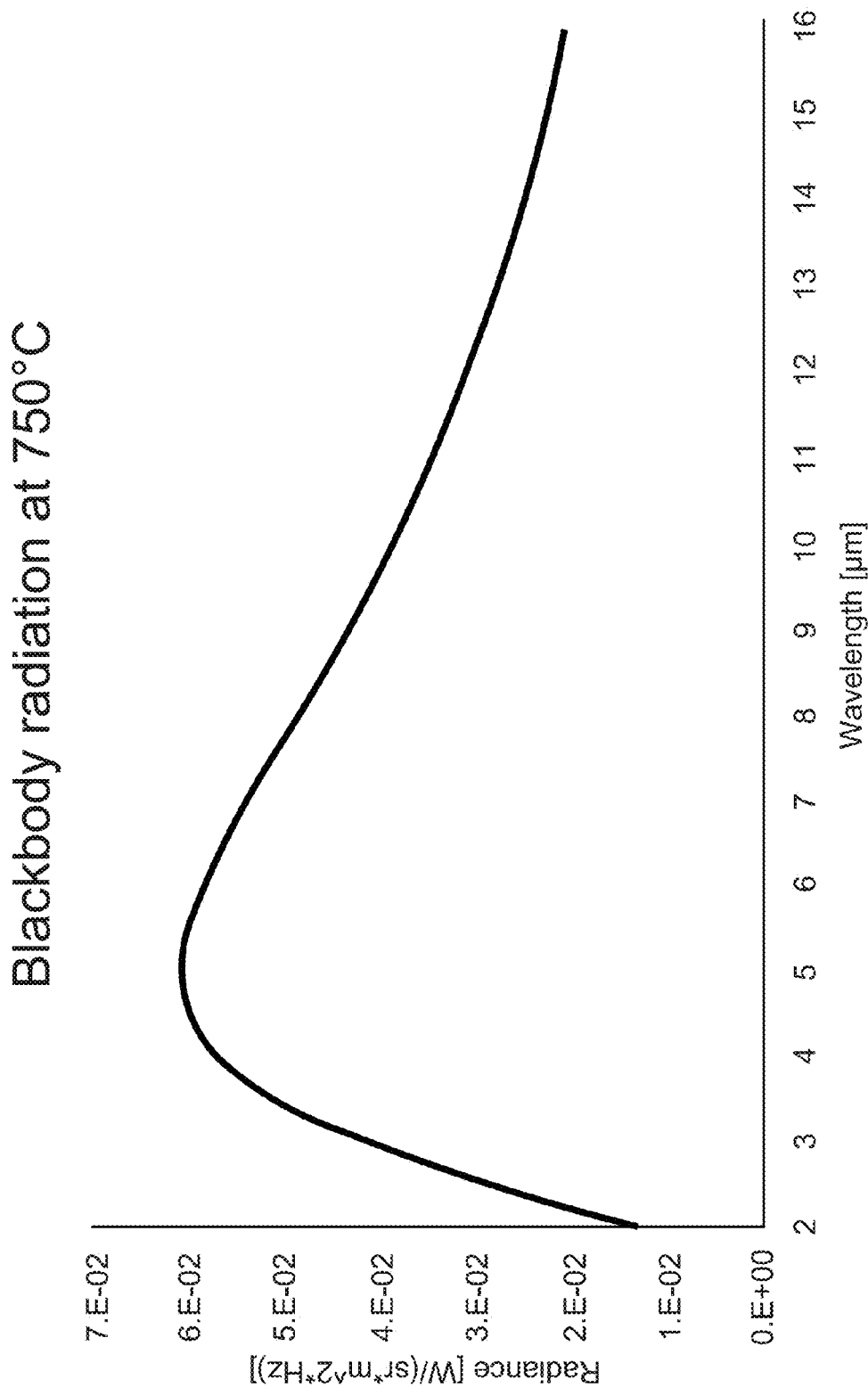
FIG. 1 shows the blackbody emission spectrum according to the law of Planck.
Figure 2:
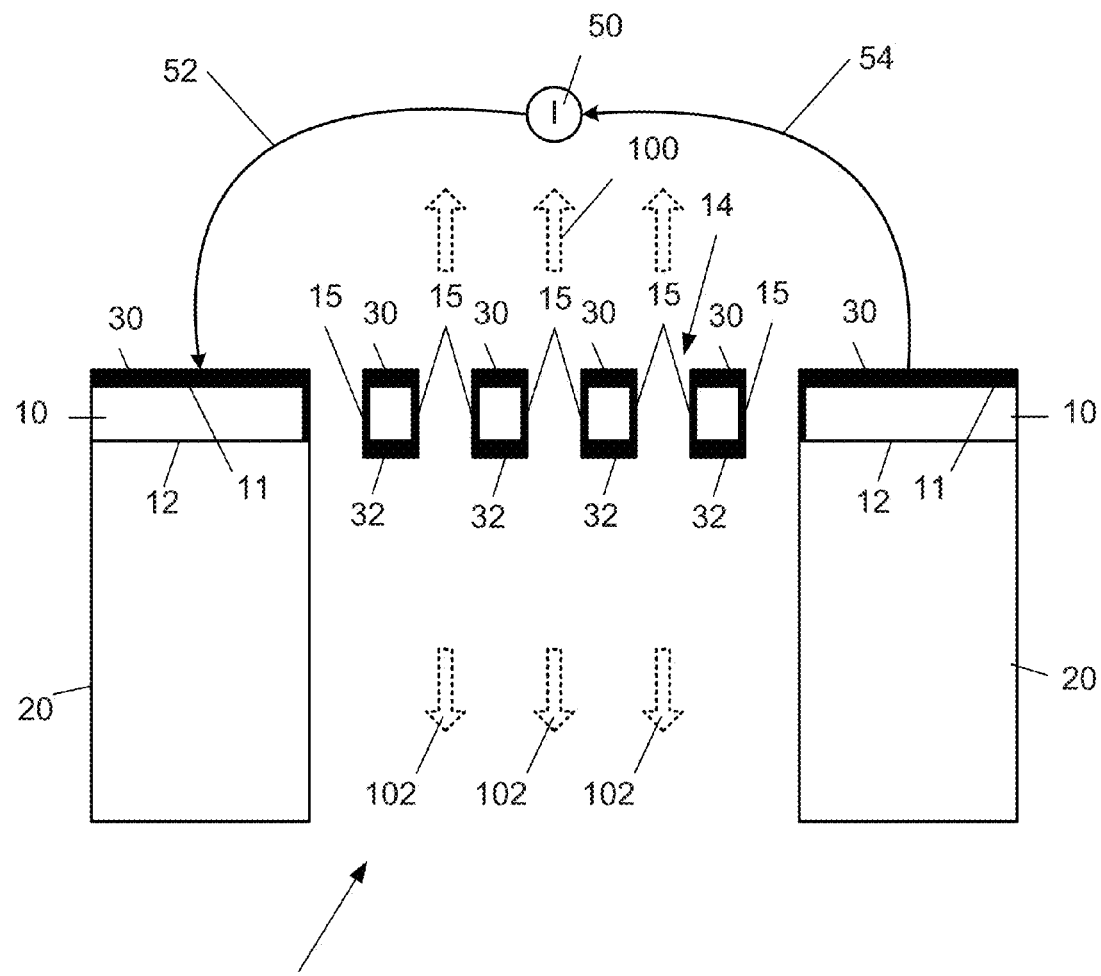
FIG. 2 shows a cross section of a representative embodiment of the infrared emitter.
Figure 3:
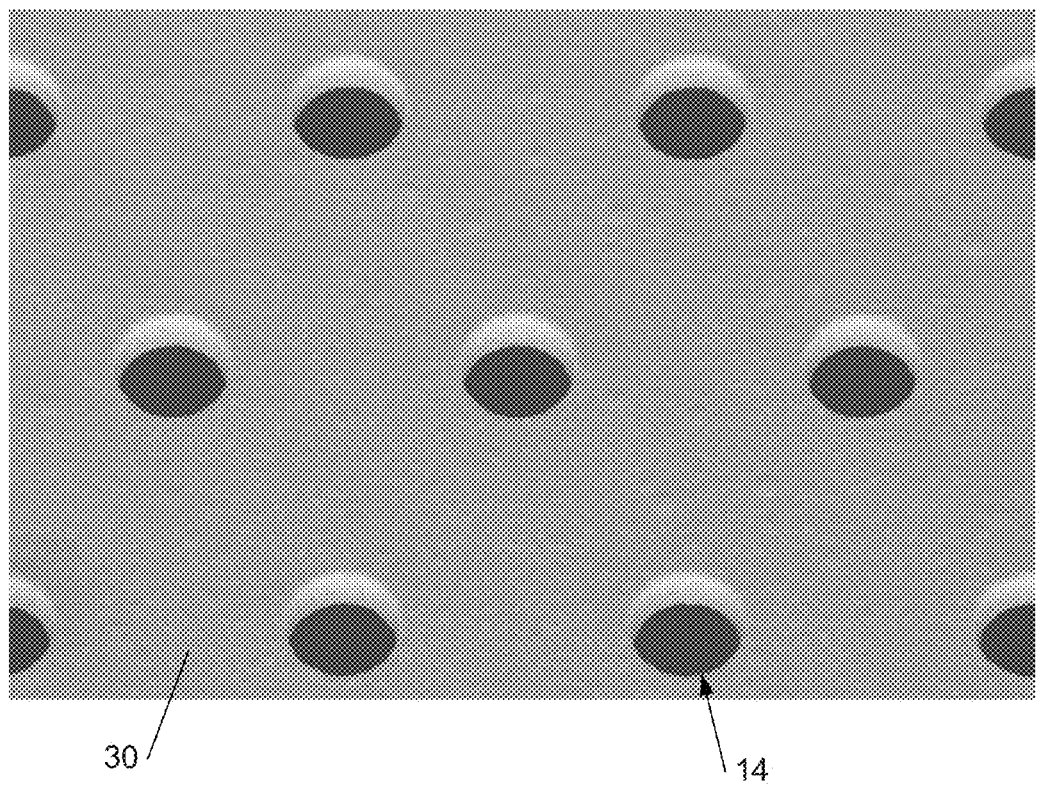
FIG. 3 shows a 3D view, obtained by a SEM image, of a membrane comprising an array of through-holes.

A representative embodiment of the infrared light emitter according to the disclosure is illustrated in FIG. 2. A substantially flat membrane 10, illustrated in FIG. 3, comprises a first surface 11 and a second surface 12 substantially parallel to the first surface 11. The flat membrane 10 comprises an array 13 of infrared wavelength sized through-holes 14. A first metal layer 30 is arranged on the first surface 11 and a second metal layer 32 is arranged on the second surface 12. The first metal layer 30 and the second 32 metal layer are deposited on the membrane 10 by conventional metal deposition techniques but other techniques may be used as well. A typical thickness of the metal layers 30, 32 is 0.5 μm. Preferably the thickness of the metal layers 30, 32 is more than 100 nm in order to assure a continuous and well adherent metal layer on the membrane, but thicknesses of less than 100 nm may be devised also for other applications, such as those requiring high modulation frequencies. A portion of the first metal layer 30 and/or the second metal layer 32 is deposited at least partially also on the wall of at least one through-hole of the two-dimensional array so that the first metal layer 30 and the second metal layer 32 are always electrically in contact. The first metal layer 30 and the second metal layer 32 is preferably, but not necessarily so, the same metal and is preferably platinum. In the representative embodiment the first metal layer 30 and the second metal layer is made of the same metal and substantially all the through-holes have their walls covered with the same metal.

The first metal layer 30 and/or the second metal layer 32 is connected to at least a first electrical wire 52 and a second electrical wire 54 so that an electrical current may be realized in the connected metal layer so that it may be heated by the electrical resistance of the metal layer 30,32.

The function of the membrane 10 is only a support for the thin metal layers 30, 32. The membrane 10 in one embodiment is made of a silicon nitride layer which has a thickness of typically some hundreds of micron. The membrane 10 is advantageously arranged to a membrane support 20 which, in some embodiments, is a structured silicon support. The membrane support 20 is intended to reinforce the membrane structure and allows to assemble the membrane 10 to a supporting member or a housing of the infrared light emitter as further explained. The membrane support 20 may be made of another material such as a metal, a ceramic material and may comprise suspension structures as further explained. The membrane 10 and the membrane support 20 are made of materials that resist to temperatures higher than 400° C. in some embodiments, and higher than 600° C. in other embodiments. When heated, the membrane area heats up to, for example, 600° C. or higher, which excludes metals such as platinum since they melt at around 300° C. Therefore the wording "resistant" means that at the operating temperature it doesn't melt, it doesn't break, and it stays relatively flat since if it is too deformed it may affect the plasmonic emission. The flatter the surface, the better emission characteristics (more efficient and more directional). By depositing certain metals having an emissivity lower than 0.1 for wavelengths higher than 700 nm on a free-standing membrane it is possible to increase the absorption to near to unity at wavelength that are close to the period of the through holes. Advantageously platinum is chosen as a metal for the metal layers 30, 32 to obtain the effect, but other metals resistant at operating temperatures above 400° C. may be used also, such as titanium, tantalum, etc.

The underlying effect is explained by the fact that an array of holes having lateral dimensions close to the wavelength of the photons, produced by the heating of the metal layers 30, 32, creates surface waves, also defined as surface plasmons, which travel across the surface of the metal deposited on the membrane 10. Due to their long propagation lengths in the plane of the membrane 10 the surface waves end up being absorbed by the heated metal layer. By advantageously choosing the sizes and the distribution of the through-holes 14 in the array 13, the absorption may be tailored. In order to obtain a significant resonant effect the distribution of the through-holes must be periodic.

An array of indentations in a thin metal film may produce an absorption effect but this effect is particularly pronounced when the holes are made through the complete thickness of the metal film, these holes being defined as through-holes. As the first metal layer 30 and the second metal layer 32 are arranged, for example by deposition techniques, on the membrane 10 that comprises the array 13 of through holes 14, the thin first metal layer 30 and the thin second metal layer 32 will comprise also through holes aligned with the through-holes of the membranes. Hereafter the wording through-holes means through-holes that are defined by the aligned through-holes in the first metal layer 30, the membrane 10 and the second metal layer 32, the through-holes as defined being illustrated in FIG. 2.

The diameter of the through-holes and the spacing between the through-holes may be varied in different embodiments. In one embodiment the first metal layer 30 and the second metal layer may be 0.1 μm thick and the diameter of the substantially circular holes may be 1.5 μm, and the center to center spacing between the holes may be 5 μm. In other embodiments with different shapes of the cross sections of the through holes other combinations of through-hole diameters and spacings may be different than in the embodiment with the substantially circular through-holes.

By slightly breaking the symmetry in one of the directions, the thermal emitter can demonstrate another useful feature—polarization dependent emission. This can be done by either small changes in the period in x or y directions or by making the holes asymmetric, for example using elongated instead of round hole shape.

The thermal emitter would work equally well if the metal connection in the holes is not perfect, i.e., it is sufficient that the electrical current goes just through the first 30 or just through the second 32 metal layer.

Higher absorptions of infrared emitted light by the heated metal layers 30, 32 are obtained with thinner metal films. So the metal films 30, 32 are made as thin as possible. Using very thin metal films has also an important advantage as it allows to obtain high modulation frequencies. Indeed, the lower the thermal mass the faster the emitted infrared light may be modulated. The high frequency modulation is realized by applying by an electrical current source 50 an alternative current to the first metal layer 30 or the second metal layer. Advantageously the thickness of the metal layers 30, 32, defined perpendicular to the plane of the metal layer 30, is smaller than 1 μm in some embodiments, is smaller than 0.5 μm in other embodiments, and is smaller than 0.2 μm in still other embodiments. In a representative embodiment the membrane 10 has a thickness of 500 nm, while the metal layers have a thickness between 100 nm-150 nm. Both layers can be made much thinner. The limit for membrane 10 thickness is limited by the needed mechanical stability of the metal layer 30 or 32 so that it remains flat and remains non-fragile under external shocks as produced by handling the device. The limit for the thickness a metal layer is defined by the need to have a substantial continuous and homogenous metal layer. In the case of, for example Pt, the thickness of the Pt layer should be above 20-30 nm.

10 Hz modulation has been experimentally demonstrated having a fall time of 10 ms for the following structure: 1 mm×1 mm membrane, SiN 500 nm thick, metal layer (Pt) 150 nm thick, using voltage rectangular pulses 0 V and 4 V with duty cycle of 50% at 10 Hz.

By adapting the thermal conductivity of the metal layers 30, 32, the conversion efficiency can be high. This conversion efficiency can be tuned by managing the thermal balance between the different parts of the thermal emitters. For example, in typical structures roughly 30% is attributed to conduction, 30% to convection and 30% to radiation. If conduction is minimized by adapting the design then the radiation intensity may be enhanced.

In the representative embodiment of FIG. 2 the first metal layer 30 is heated by applying an electrical current to the first metal layer 30.

According to the disclosure the emitted infrared electromagnetic radiation produced by the heating of the first metal layer 30 has wavelengths centered around a specific predetermined wavelength ($\lambda$) and having a full width of half maximum ($d\lambda$), where $d\lambda/\lambda$ is equal to or less than 0.3. In an embodiment the full width of half maximum is less than 3000 nm, is less than 2000 nm in other embodiments, is less than 1000 nm in still other embodiments, and is less than 1000 nm in yet other embodiments.

The periodically distributed through-holes have preferably a hexagonal, rectangular or parallelogram distribution geometry. The through-holes traversing the three layers (i.e. first metal layer 30, membrane 20 and second metal layer 32) have preferably substantially circular cross section shapes. The cross sections extend about an axis traversing the three layers, the axis is also being defined as the length of the through holes. The through-holes may have any cross section shape, such as elliptical, square, or triangular, hexagonal or any suitable shape, including but not limited to polygonal shapes.

In a variant the through holes in the array 13 do not all have to have the same shape or the same cross section shape in the length of the through-holes. In a variant the array 13 may be interlaced by at least a second two-dimensional distribution of through holes having another periodicity. This allows to shape the spectrum of the emitted near infrared beam by the heated thin metallic layer. The at least second two-dimensional distribution of through holes may comprise through-holes that have another cross section, for any position in the length of the through-holes, than the cross section of the through-holes of the array 13.

Figure 4:
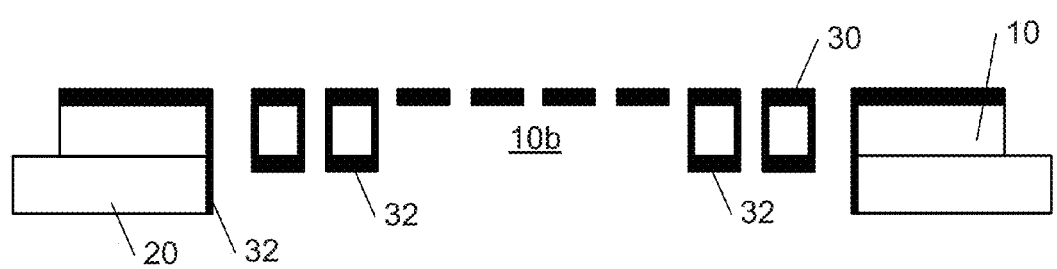
FIG. 4 shows a cross section of an infrared emitter comprising an etched portion in the second metal layer and the membrane.

In an embodiment illustrated in FIG. 4 a portion of the second metal layer 32 and a portion of the membrane 10 is etched away so as to provide a portion of the first metal layer 30 which is free standing. This allows to heat the portion of the first metal layer which is very thin and provides a way to improve the modulation frequency. In a embodiment there may be several etched portions of the second metal layer 32 and of the membrane 10. In another embodiment a portion of the first metal layer 32 and a portion of the membrane 10 may be etched away so as to provide a portion of the first metal layer 30 which is free standing. In that case the second metal layer 32 is connected to the two electrical wires 52, 54 and an electrical current source 50.

In an exemplary realisation a Pt metal layer having a thickness of 50 nm may have a dimension of its free standing portion, defined in the plane of the Pt layer, of more than 0.5 mm in some embodiments, of more than 1 mm in other embodiments, and more than 2 mm in still other embodiments. The dimension is limited by the thickness of the metal layer but also depends on the vibrations of the environment in which the device is intended to be used.

Figure 7:
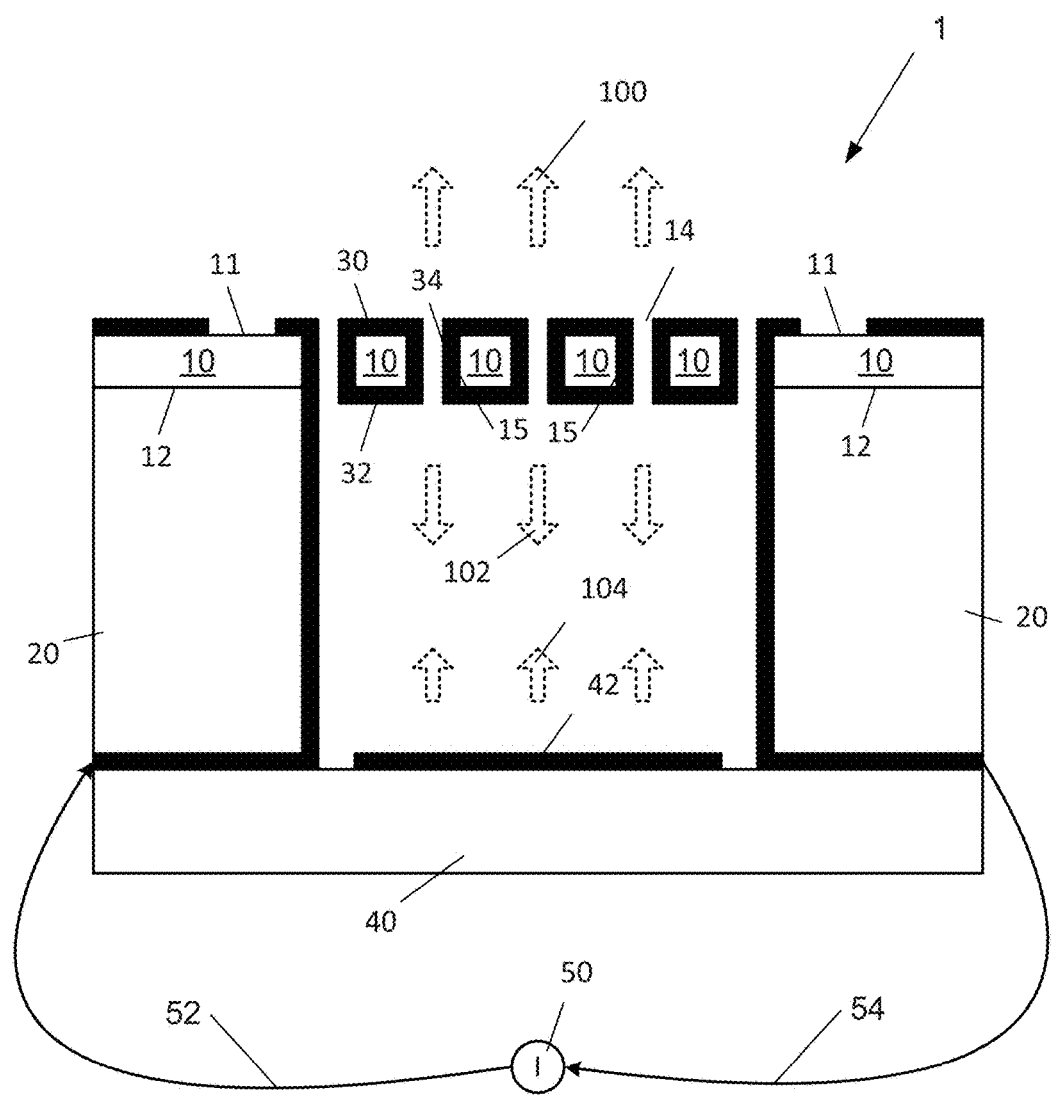
FIG. 7 shows an infrared emitter with electrical contacts arranged on a second metal layer.

Different configurations may be used to contact the first metal layer 30 or the second metal layer 32. In an embodiment of the infrared emitter, illustrated in FIG. 7, the second metal layer 32 is connected to two electrical wires 52, 54. The configuration of the embodiment of FIG. 7 may be useful when the infrared emitter is arranged in a housing as further explained. In all embodiments the first metal layer 30 and the second metal layer 32 are in electrical contact and so both are so both are contacted to an electrical current source 50.

In an embodiment the first metal layer 30 and/or the second metal layer 40 may comprise several metal layers and comprise a main metallic layer, such as a platinum layer, and also an adhesion layer arranged to the main metallic layer to the side of the membrane 10, and may comprise an additional layer arranged to the main metallic layer to the side away from the membrane 10. The adhesion layer and/or the additional layer are, for example, metallic layers in some embodiments, and at least one of them may comprise several different metallic layers.

In an embodiment, the first metal layer 30 and/or the second metal layer 40 comprises a main layer made of platinum and comprises an adhesion layer made of tantalum (Ta). The main platinum layer may be covered, to the side away from the membrane 10 with a second thin layer of tantalum to prevent oxygen to reach the adhesion layer, as oxygen may penetrate through platinum (Pt is transparent to O2) and affect the adhesion layer and so the lifetime of the device. The adhesion layer, in the case of a main layer of platinum, is preferably a thin Ta adhesion layer, having a thickness of about 10 nm, deposited on the membrane 10. Preferably a platinum layer having a thickness between 100 nm-150 nm is used as the main metal layer and preferably a thin Ta protective layer having a thickness between 5 and 15 nm, and 10 nm in some embodiments, is deposited on the platinum layer, to the side away from the membrane 10.

Figure 8A:
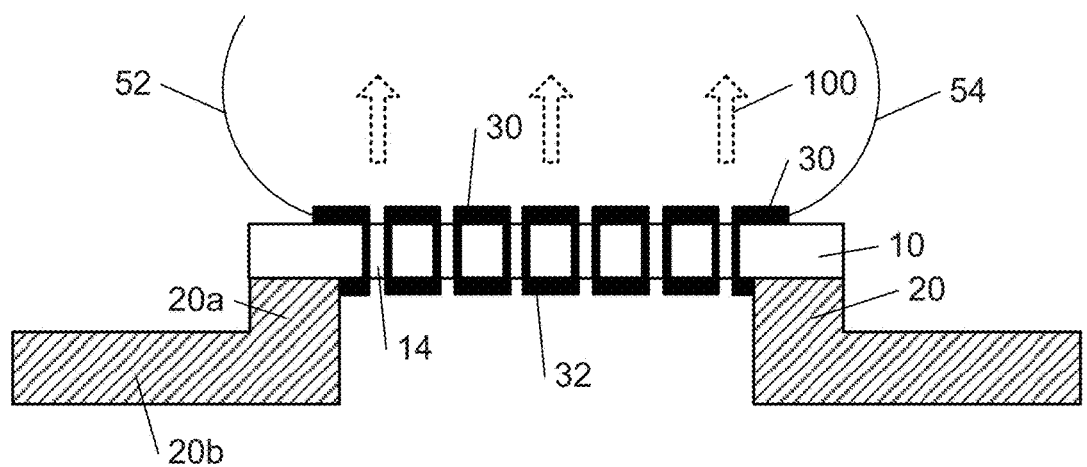
FIGS. 8a and 8b show an infrared emitter comprising a suspension beam.
Figure 8B:
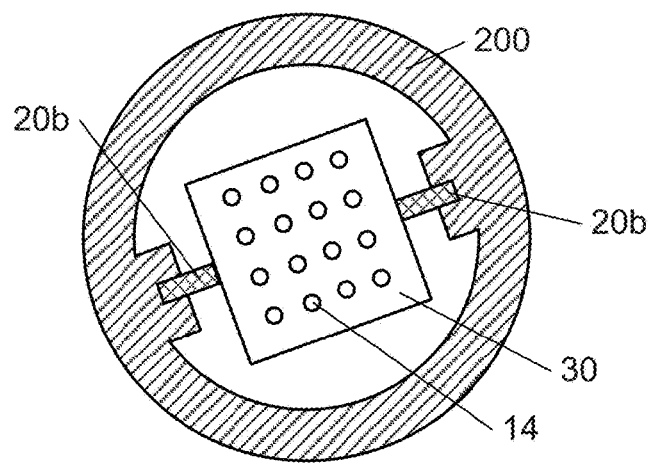
Figure 9:
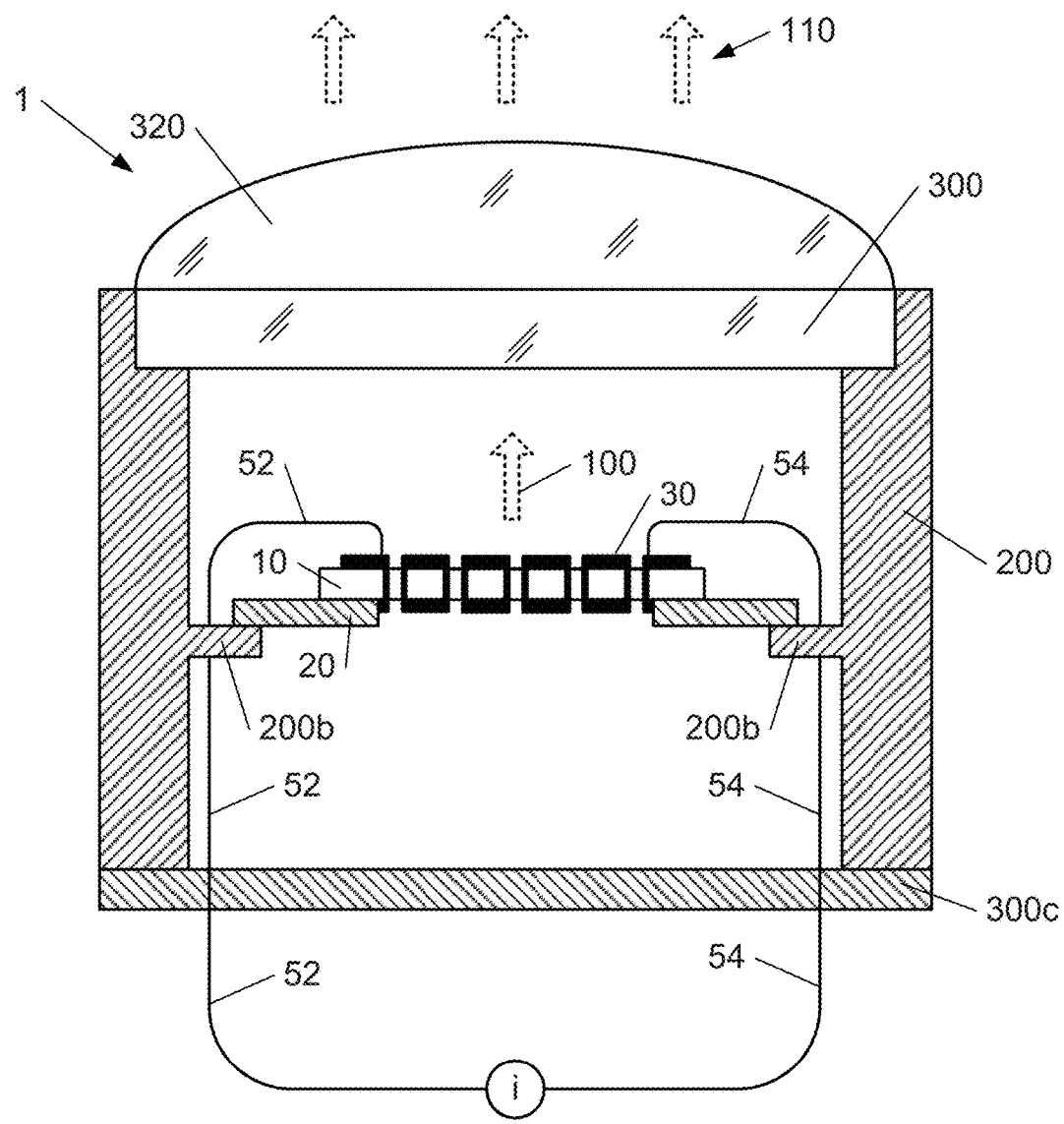
FIG. 9 shows an infrared emitter comprising a housing, an infrared transparent window and a lens.

In an embodiment the infrared emitter 1 comprises at least one suspension beam. A suspension beam may be realized by adapting the shape of the membrane support 20 as illustrated in FIGS. 8a, 8b. In an embodiment the suspension beam is formed by adapting the membrane support 20 so that it comprises a first part 20a and a second part 20b, this second part 20b may be used to adapt the membrane inside a housing 200 as illustrated in FIG. 8b. The housing 200 may comprise a structure 200b to which the second part 20b may be attached as illustrated in FIG. 9.

Figure 5:
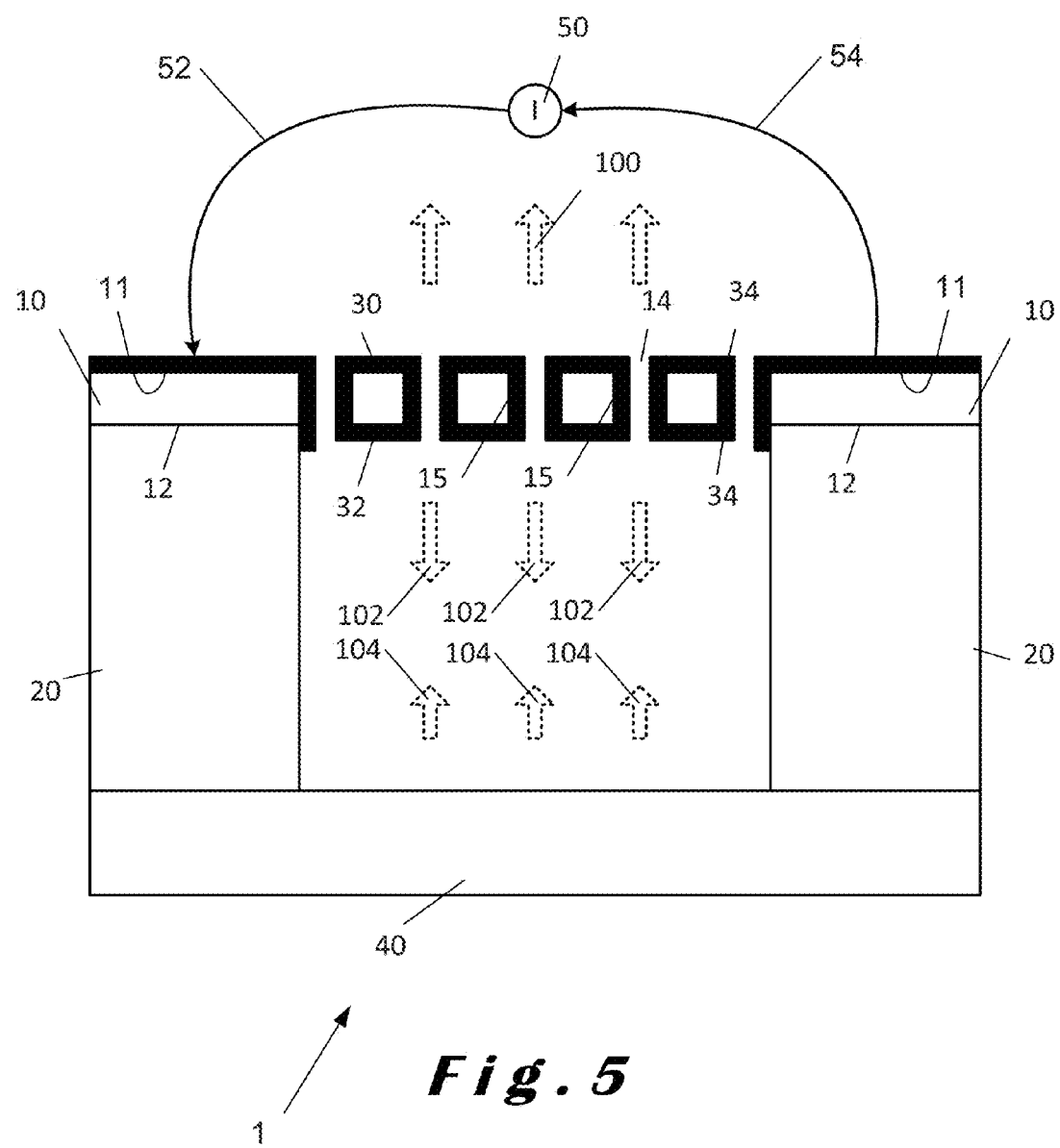
FIG. 5 shows an infrared emitter comprising a membrane support base.

In an embodiment a membrane support base 40 may be arranged to the membrane support 20, to the side of the membrane 10, as illustrated in FIG. 5. A membrane support base 40 may serve to reinforce mechanically the infrared emitter and may also be arranged to add light reflecting structures on it.

Figure 6:
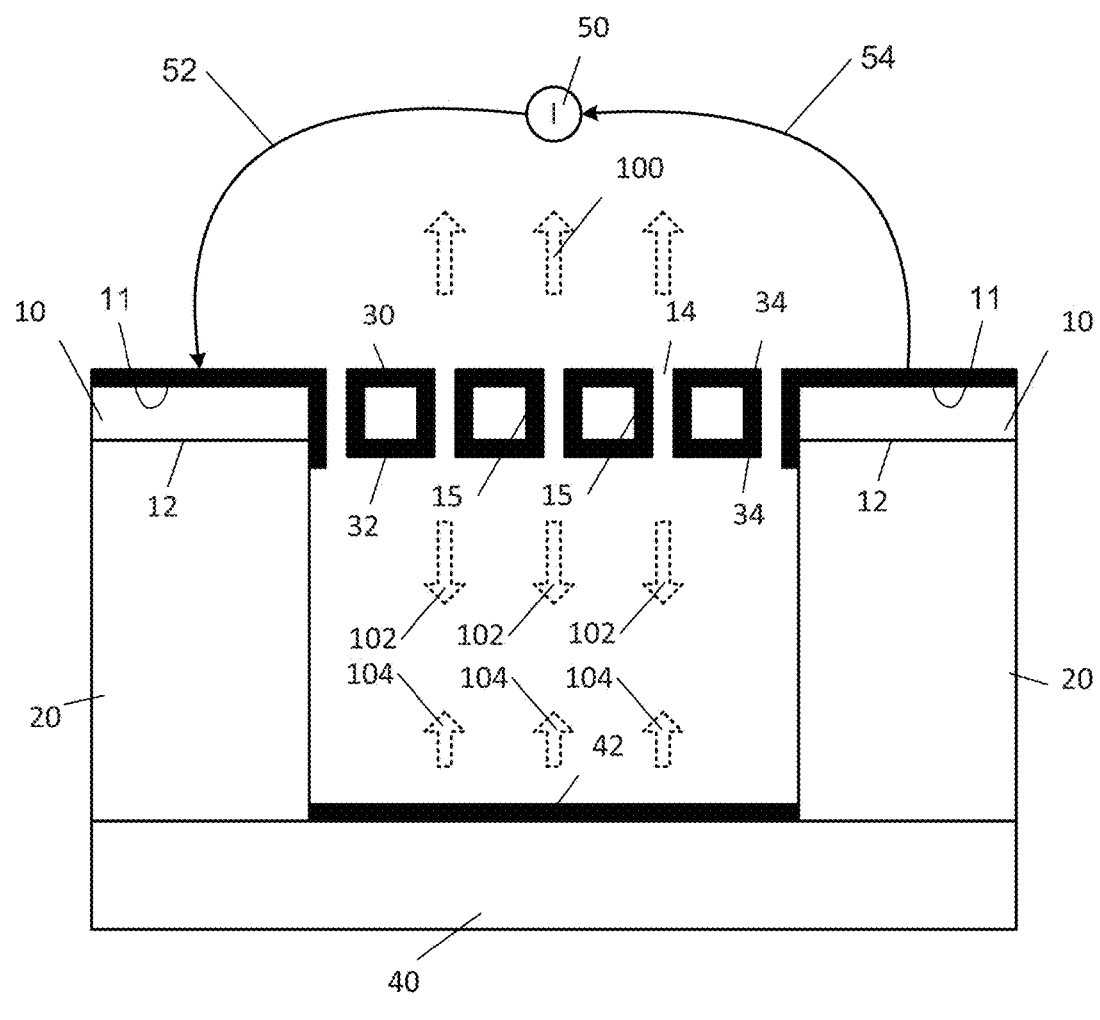
FIG. 6 shows an infrared emitter comprising a reflecting layer arranged on a membrane support base.

In an embodiment, illustrated in FIG. 6, the membrane support base 40 comprises an infrared reflecting layer 42 arranged to the side of the membrane 10, the reflecting layer 42 being arranged to reflect at least a reflected portion 104 of a second infrared light beam 102 emitted by the membrane 10 to the side opposite to the first surface 11. The infrared reflecting layer 42 may be arranged to absorb a part of the incident infrared radiation incident on it, which may be realised by an appropriate coating for example.

In an embodiment the reflecting layer 42 is a structured reflecting layer. The structured reflecting layer may be a structured metallic layer.

In an embodiment the reflecting layer 42 is a diffracting layer.

In an embodiment the reflecting layer 42 can be arranged to focus at least a portion of the reflected portion 104 into at least one of the through holes 14.

Figure 10:
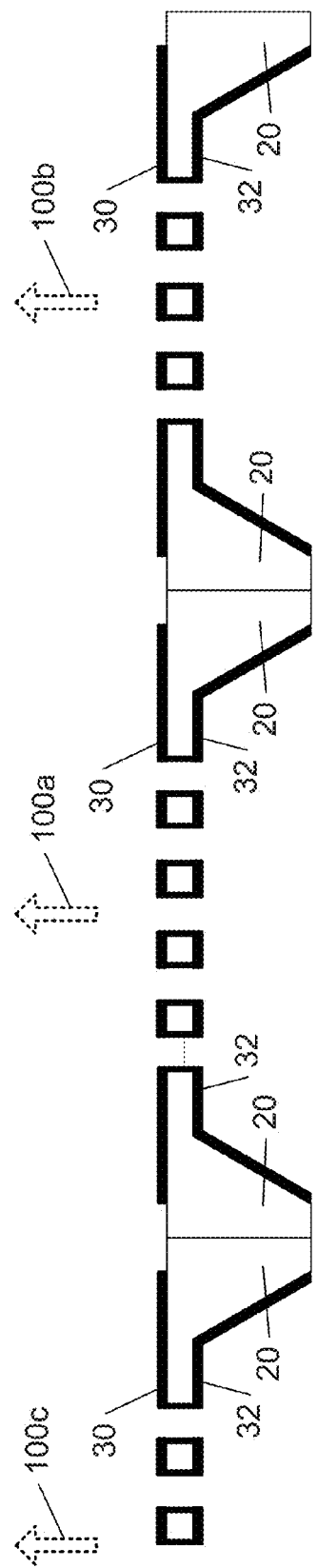
FIG. 10 shows a cross-section schematic of infrared emitter comprising a plurality of infrared emitters.

In an embodiment illustrated in FIG. 10 an infrared emitter array 2 comprises at least two infrared emitters. Arranging a plurality of infrared emitters in an array allows to provide a higher infrared intensity and allows also to have a wide design capability. The array may be a linear array or a two-dimensional array and may comprise different geometries such as for example a square array or a hexagonal array. By adapting the individual thermal emitters of the array 2 one may tune the infrared emitting characteristics and provide for example an infrared beam 100 having two infrared emission peaks.

Figure 11:
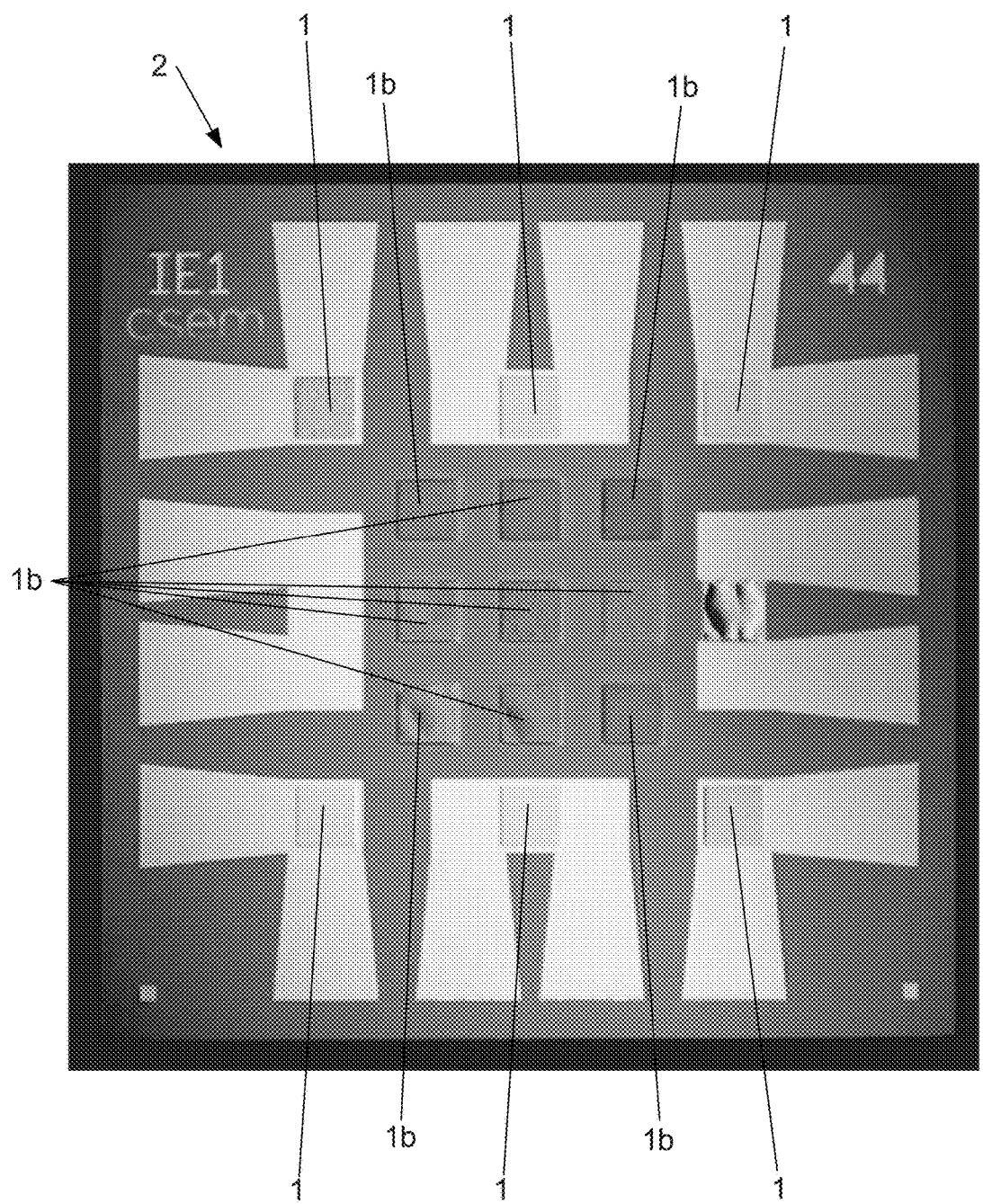
FIG. 11 shows a realized infrared emitter comprising an array of independently electrically driven infrared emitters.

FIG. 11 shows a realized sample of an infrared emitter array. The realised sample of FIG. 11 comprises 6 infrared sources, 3 at the bottom and 3 on the top; the other features in the figure are test structures. Each source contains one membrane with a specific period and hole size (defining peak position and spectral width). Bottom array of sources contain 3 different hole period and size, which are repeated on the top. The metal layer is realized in a way that it extends in trapezoidal fashion towards the edge of the chip where the wirebonding to the chip holder is typically done (for connection to the current source). In the sample of FIG. 11 the thermal emitter comprises a Pt metallized SiN membrane with a through-hole period 6.1 microns and the hole size 3.5 microns. The operating membrane temperature in the sample of FIG. 11 is roughly 550° C.

Figure 12:
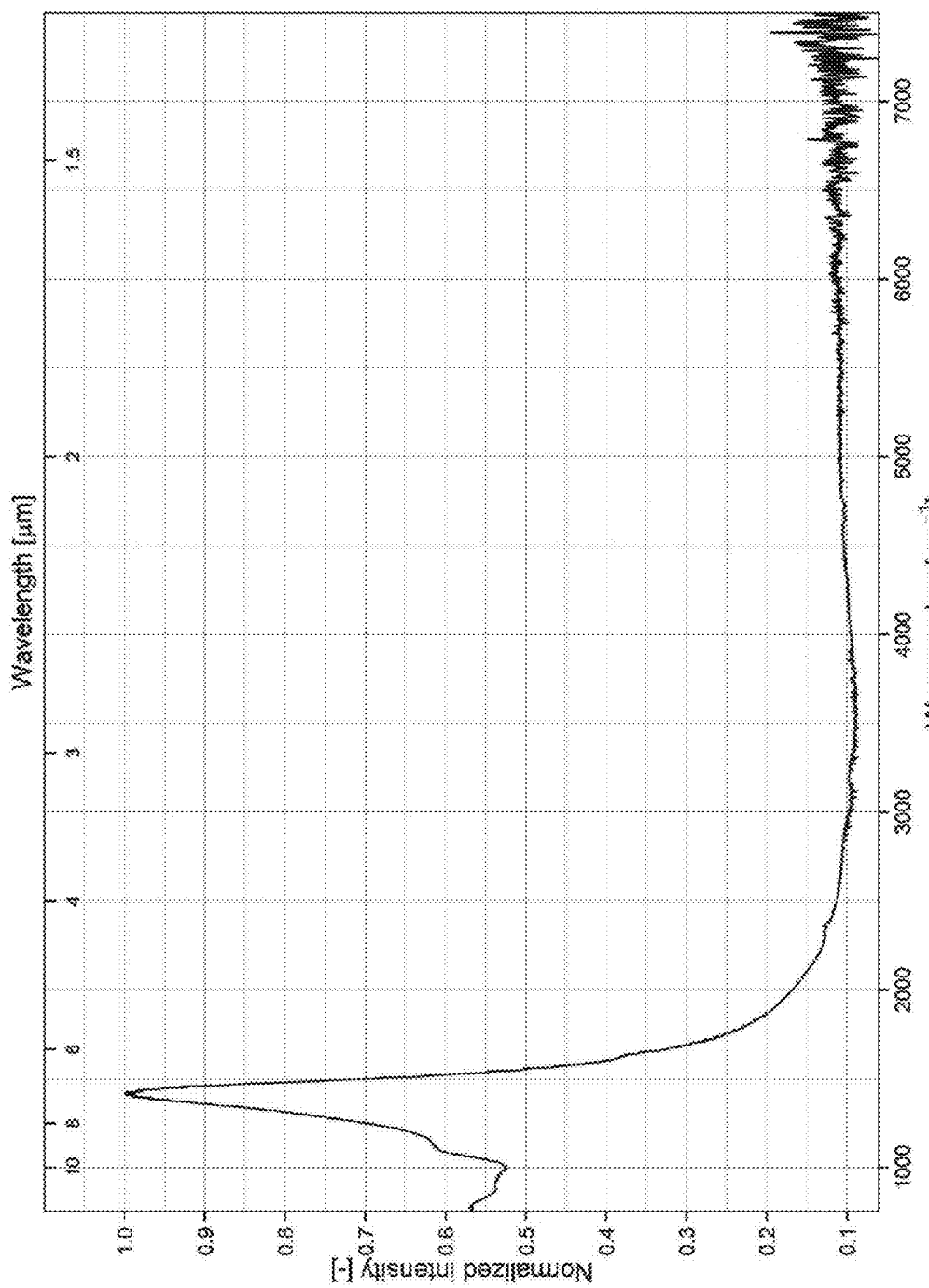
FIG. 12 shows the infrared spectral characteristic of the infrared beam emitted by one of the infrared emitter membranes from FIG. 11.

FIG. 12 shows the spectral characteristics of typical thermal emitter of the disclosure. The spectrum in FIG. 12 is a response of a single thermal emitter comprising a Pt metal layer having a thickness of 0.15 µm, a membrane thickness of 0.5 µm and 3.5 µm diameter through-holes and a through-hole periodicity of 6.1 µm. The estimated membrane temperature is 550° C.

In an embodiment the infrared emitter comprises a housing 200. In an embodiment the housing may comprise an infrared transparent window 300 and/or a lens 320 as illustrated in FIG. 9. In the embodiment of FIG. 9 the two electrical wires are fed through a housing base 300c.

It is generally understood that the fabrication of the infrared emitter may be made by MEMS manufacturing methods which are well known in the art.

The disclosure is further achieved by a method for obtaining an infrared light beam 100 in a narrow band of infrared wavelengths and having a high angular directivity, wherein an infrared emitter as described provides infrared light by the heating of the first or second metal layer by resistive heating provided by the electrical current of a current source connected to the first or second metal layer.

The invention claimed is:

1. An infrared emitter comprising:
a metalized membrane, emitting infrared light in operation, wherein
said membrane comprises a first surface and a second surface, parallel to said first surface, said membrane comprising a two dimensional array of through-holes, each of said through-holes extending from said first surface to said second surface;
said membrane is arranged on a membrane support, said membrane and said membrane support are made of a material that is resistant to temperatures higher than 400° C.;
said through-holes are arranged as a two-dimensional periodic array, any cross section of said through-holes having a maximum dimension smaller than any wavelength of the emitted infrared spectrum of said infrared light;
a first metal layer is arranged on at least a portion of said first surface and a second metal layer is arranged on at least a portion of said second surface, said first metal layer and said second metal layer comprising each a two-dimensional through-hole array aligned and facing said two dimensional periodic array of said membrane;
a portion of said first metal layer and/or said second metal layer is deposited at least partially on the wall of at least one through-hole of said two-dimensional array;
said first metal layer or said second metal layer are connected to an electrical current source;
the at least one of said first metal layer or said second metal layer is adapted to emit infrared light in response to resistive heating caused by the introduction of electrical current in said first metal layer and/or said second metal layer, said infrared light having an infrared spectrum which is determined in response to the decay of plasmons in said first metal layer and/or said second metal layer;
said infrared emitter is arranged to provide at least an emitted infrared light beam to the side of said first surface and in a direction opposite to said second surface, said infrared light beam having wavelengths higher than 700 nm and having an angular distribution smaller than a Lambertian distribution; and
said infrared emitter comprises modulation means arranged so that said emitted infrared light beam may be modulated in intensity with a frequency higher selected from a group consisting of higher than 10 Hz, higher than 20 Hz, and higher than 50 Hz.

2. The infrared emitter according to claim 1, wherein said membrane is a SiN membrane.

3. The infrared emitter according to claim 1, wherein a portion of said first metal layer is free standing.

4. The infrared emitter according to claim 1, wherein a portion of said second metal layer is free standing.

5. The infrared emitter according to claim 1, wherein said membrane support is made in silicon.

6. The infrared emitter according to claim 1, wherein said first metal layer is made of the same metal as said second metal layer.

7. The infrared emitter according to claim 1, wherein a membrane support base is arranged to said membrane support to the side of said second surface.

8. The infrared emitter according to claim 7, wherein said membrane support base comprises a reflecting layer arranged to the side of said second surface, said reflecting layer being arranged to reflect at least a reflected portion of a second infrared light beam emitted by said membrane to the side opposite to said first surface.

9. The infrared emitter according to claim 8, wherein said reflecting layer is a structured reflecting layer.

10. The infrared emitter according to claim 8, wherein said reflecting layer is a metallic layer.

11. The infrared emitter according to claim 8, wherein said reflecting layer is a diffracting layer.

12. The infrared emitter according to claim 8, wherein said reflecting layer is arranged to focus at least a portion of said reflected portion into at least one of the through holes.

13. The infrared emitter according to claim 1, wherein said membrane has a greatest dimension, in the plane of said membrane, which is selected from the group consisting of more than 1 mm, more than 2 mm, and more than 3 mm.

14. The infrared emitter according to claim 1, wherein said membrane support comprises at least one suspension beam.

15. The infrared emitter according to claim 1, wherein said infrared emitter comprises a housing comprising at least one infrared transparent window and/or at least one infrared transparent lens.

16. An infrared emitter array comprising at least two infrared emitters according to claim 1.

17. Method for obtaining an infrared light beam in a narrow band of infrared wavelengths and having a high angular directivity, wherein an infrared emitter according to claim 1 is supplied by electrical current by the current source.

* * * * *